United States Patent
Fruhauf et al.

[11] Patent Number: 5,291,139
[45] Date of Patent: Mar. 1, 1994

[54] CIRCUIT FOR DETECTION OF THE STATE OF AN INTEGRATED CIRCUIT FUSE IN A BALANCED FUSE CONFIGURATION

[75] Inventors: Serge Fruhauf, Peynier; Francois Tailliet, Epinay sur Seine, both of France

[73] Assignee: SGS-Thomson Microelectronics S.A., Gentilly, France

[21] Appl. No.: 683,245

[22] Filed: Apr. 10, 1991

[30] Foreign Application Priority Data

Apr. 10, 1990 [FR] France ............... 90 04584

[51] Int. Cl.⁵ .............. G01R 31/02; G01R 17/00; G01R 31/28; H01H 85/30
[52] U.S. Cl. .................... 324/550; 307/362; 324/158 R; 324/679; 324/705; 340/638
[58] Field of Search .......... 324/550, 679, 705, 158 R, 324/73.1, 537; 340/638; 307/350, 355, 359, 362; 365/96

[56] References Cited

U.S. PATENT DOCUMENTS

| | | | |
|---|---|---|---|
| 4,104,546 | 8/1978 | Seiler | 307/362 |
| 4,625,162 | 11/1986 | Bosnyak | 324/551 |
| 4,701,780 | 10/1987 | Hankins et al. | 357/51 |
| 4,730,129 | 3/1988 | Kunitoki et al. | 307/362 |
| 4,835,423 | 5/1989 | de Ferron et al. | 307/584 |
| 4,860,258 | 8/1989 | Fruhauf et al. | 365/194 |
| 4,890,187 | 12/1989 | Tailliet et al. | 361/111 |
| 4,924,212 | 5/1990 | Fruhauf et al. | 340/598 |
| 4,932,053 | 6/1990 | Fruhauf et al. | 380/4 |

FOREIGN PATENT DOCUMENTS

| | | |
|---|---|---|
| 0151849 | 8/1985 | European Pat. Off. |
| 0252325 | 1/1988 | European Pat. Off. |
| 2587531 | 3/1987 | France . |
| 2605765 | 4/1988 | France . |
| 2600795 | 11/1990 | France . |
| 9104473 | 4/1991 | World Int. Prop. O. |

*Primary Examiner*—Gerard R. Strecker
*Attorney, Agent, or Firm*—Robert Groover

[57] ABSTRACT

A circuit for the detection of a fuse with oxide vertical fusing has another fuse that is of the same type but cannot be blown and, in parallel with each of the fuses, a voltage reference circuit. The output of each of the voltage reference circuits is an input of a differential comparator. This differential comparator is preferably provided with a voltage reference circuit that is independent of the supply voltage Vcc.

27 Claims, 2 Drawing Sheets

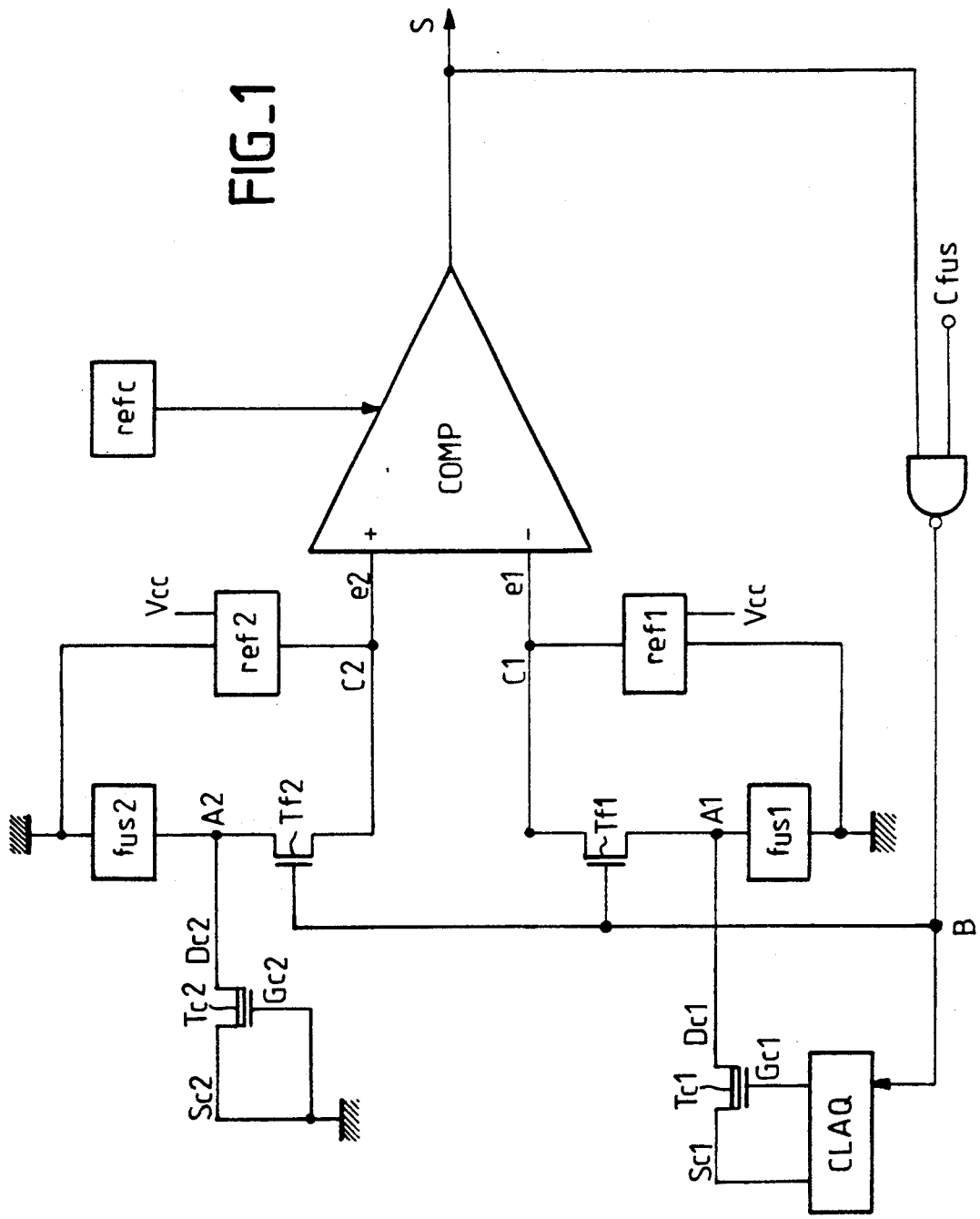

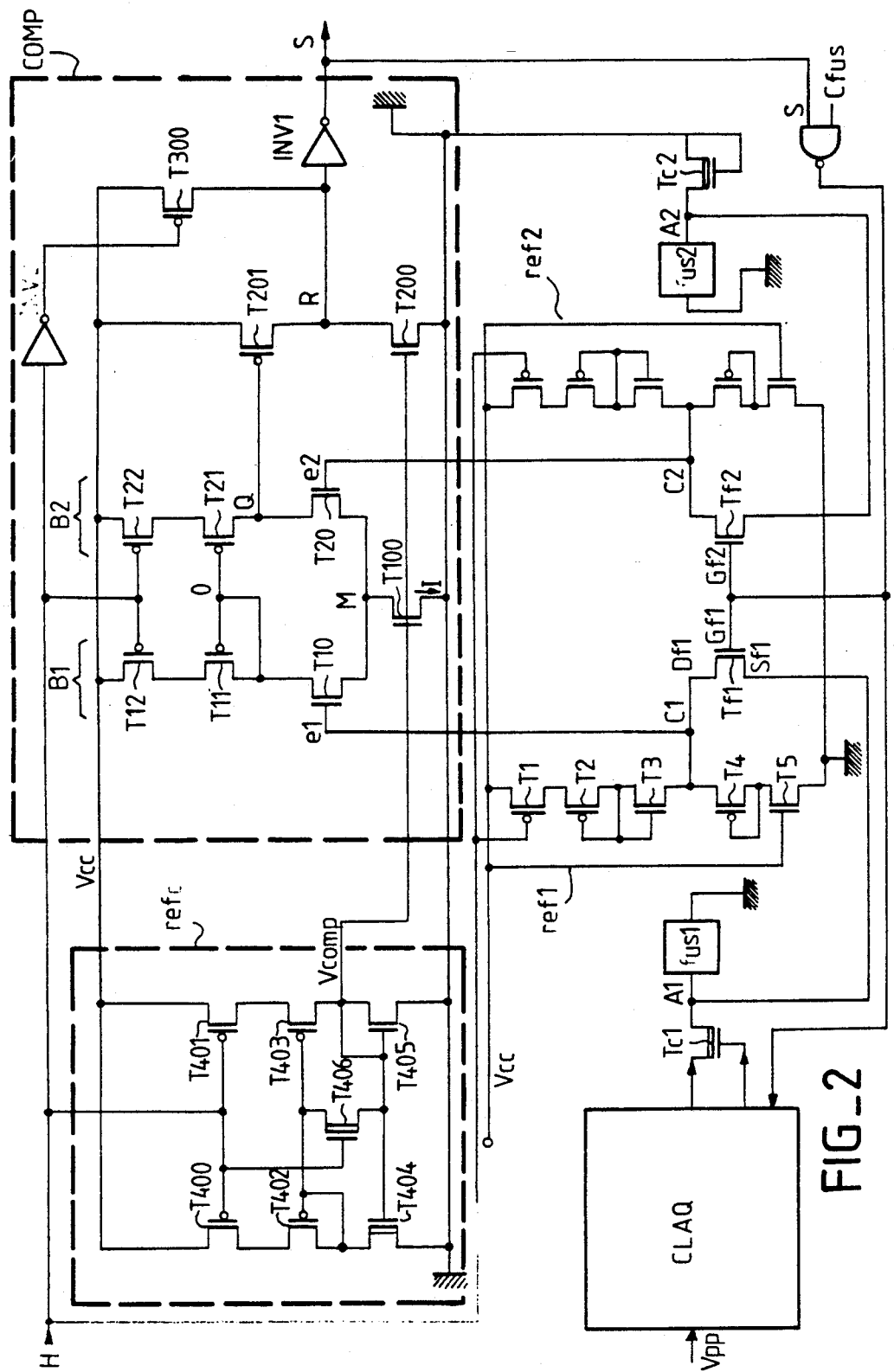
FIG_2

CIRCUIT FOR DETECTION OF THE STATE OF AN INTEGRATED CIRCUIT FUSE IN A BALANCED FUSE CONFIGURATION

BACKGROUND OF THE INVENTION

1. Field of the Invention

The present invention relates to a circuit for the detection of fuses with vertical oxide fusing.

Fuses are used in integrated circuits, for example for the definition of functions or access paths, or to fulfil an access-locking function in tamper-proof circuits. They have two possible states: the initial state, when they are intact, and the irreversible, final state when they are fused or blown.

2. Description of the Prior Art

The fuses currently used in integrated circuits may be made:

- of metal. Their drawback then is that they can be short-circuited.

- of polysilicon. Their drawback then is that the blown fuse can grow back.

- on the basis of two EEPROM cells. The blank or virgin cells are in a same unknown state. One may be only erased and the other may be only programmed. The blowing is obtained, for example, by activating the programming of the double cell. Since only one cell may be programmed, the combined OR output of the two cells changes state. But a circuit such as this takes up a great deal of space.

- with one EEPROM cell, the blowing of which consists in the evaporation of its oxide tunnel by the sending, for example, of one or more programming signals with very steep front edges. However, the writing and reading cells are then complex, and a fuse such as this is bulky There is a known association of a very thin oxide zone with a transistor. The purpose of the oxide zone is to change the state of the transistor. This type of a use is described in the U.S. Pat. No. 4,701,780.

This use is substantially equivalent to that of an EEPROM cell with tunnel oxide fusing.

SUMMARY OF THE INVENTION

In the invention, only the capacitor, namely the very thin oxide zone, is used to make a fuse. The oxide thickness of the fuse is, for example, 80 angstroms. The electrical field needed for the fusing is then of the order of 20 mv/angstroms. In practice a fuse voltage of 17 volts applied to the terminals of the capacitor is enough. This fuse voltage is applied, for example, conventionally by a transistor controlled by the fusing signal. The fuse voltage comes either from an internal load pump which uses the 5 volts supply voltage of the integrated circuit to produce a fuse voltage such as this, or from an external contact: in this case, there is an electrostatic discharge protection to prevent malfunctioning.

Such a fuse is the equivalent of a capacitor in the initial state. It is the equivalent of a resistor in the blown state. It is therefore not possible to use known fuse detection circuits.

Indeed, in the case of fuses made of metal or polysilicon, their initial state is equivalent to a resistor and their blown state is equivalent to an open circuit. The states to be detected are different from those of the fuse with oxide fusing. The detection principle therefore cannot be the same.

In the case of EEPROM cells, the detection circuit is a detector of the current flowing in the cell. It cannot be applied to a fuse with oxide vertical fusing that is not associated with such an EEPROM cell.

In the invention, in the circuit for the detection of a fuse, a second fuse that cannot be blown is used: this second fuse is therefore always in the initial state. A voltage reference circuit associated with each of the fuses then dictates a reference voltage, the level of which is a function of the state of the fuse.

The two reference voltages are thus applied to the two inputs of a differential comparator. If the two fuses are in the same initial state, the two reference voltages are equal. The output S of the comparator is, for example, five volts. If the first fuse is blown, the two reference voltages are no longer equal and the output of the comparator flips over to 0 volts.

Thus, an object of the invention is a circuit for the detection of a fuse with two possible states, of the type with oxide vertical fusing. The detection circuit has a second fuse with only one possible state, of the same type, and each fuse has a voltage reference circuit in parallel, between the ground and a respective input point of a differential comparator.

BRIEF DESCRIPTION OF THE DRAWINGS

The invention will be understood more clearly the following description and from the appended drawings. These description and figures are given purely by way of indication and in no way restrict the scope of the figures:

FIG. 1 shows a schematic diagram of a detection circuit according to the invention;

FIG. 2 shows an exemplary embodiment of a circuit according to the invention.

DETAILED DESCRIPTION OF THE INVENTION

FIG. 1 shows a schematic diagram of a circuit according to the invention.

A differential comparator COMP has two inputs e1, e2, an output S, and its own voltage reference circuit refc.

A fuse fus1 and a fuse fus2 each have their two terminals connected as follows: one to the ground and the other to a node, respectively A1, A2.

A MOS transistor Tf1, Tf2 respectively, is series connected between the node A1, A2 respectively, and a node C1, C2 corresponding respectively to the input e1 and e2 of the comparator.

Between the ground and the node C1, C2 respectively of the comparator, there is a voltage reference circuit ref1, ref2.

A MOS transistor Tc1 for the blowing of the fuse fus1 is placed in series between a fusing circuit CLAQ and the node A1. In the example, it is a native N type transistor with a threshold voltage very slightly above 0 volts, of the order of 200 mv. Its gate Gc1 and its source Sc1 are controlled by the fusing circuit. Its drain Dc1 is connected to the node A1. It is the transistor Tc1, upon a fusing command, that conveys the fuse voltage Vpp to the terminal A1 of the fuse fus1: the transistor Tc1 is then equivalent to a short-circuit.

A MOS transistor Tc2 is placed in series between the ground and the node A2. The transistor Tc2 is technologically identical to the transistor Tc1. In the example, it is a native transistor with a threshold voltage that is very slightly greater than 0 volts, of the order of 200 mv. Its gate Gc2 and its source Sc2 are connected to the ground: it is always off. Its drain Dc2 is connected to the node A2.

The output S of the comparator is looped to an input of a NAND logic gate. The other input of the NAND gate is a control signal Cfus for the blowing of the fuse fus1. The output of the NAND gate is connected to the fusing circuit which it controls. The output of the NAND gate is also connected at the node B to the gates of transistors Tf1 and Tf2.

The transistors Tf1 and Tf2 enable the reading of the state of the fuse fus1 to be prevented during the blowing of this fuse, so that the comparator does not give an erroneous element of information at output S when the state of the fuse is changed. Indeed, during the change of state, the nodes C1 and C2 must remain at the same identical potential so that the output S of the comparator does not flip over and then prevent the blowing of the fuse fus1 by negative feedback of the output of the NAND gate.

As shall be seen hereinafter, the role of the transistors Tc2 and Tf2 is to have the two inputs e1 and e2 of the comparator at a potential that is as identical as possible, when the fuse fus1 is not blown: for these voltages at e1 and e2 to be identical, the circuits that define these voltages should be identical.

When the fuse fus1 is not fused, fus2 being in the same state, the two fuses are each equivalent to a capacitor. Since, in the invention, the two fuses are technologically identical, their equivalent capacitors have identical values. The reference circuits ref1, ref2 are also technologically identical in the invention: at the input of the comparator, the voltages e1, e2 each become equal to the reference voltage Vref1=Vref2 given by the voltage reference circuits ref1, ref2, associated with the fuses fus1, fus2.

When the fuse fus1 is blown, it is equivalent to a resistor: it draws a certain current that is given by the associated voltage reference circuit ref1: the output voltage of the voltage reference circuit ref1, at the node C1, is then drawn towards the ground. The node C1, which corresponds to the input e1 of the comparator, then assumes a value close to 0 volts, as a function of the value of the equivalent resistance of the blown fuse fus1 and of the current that may be given by the voltage reference circuit ref1. The other input e2 of the comparator is, for its part, still equal to Vref2: the output S of the comparator will therefore flip over.

Thus, the use of a voltage reference circuit in parallel with each of the fuses, and of a differential comparator, enables a simple detection of the state of the fuse fus1.

This detection is all the more reliable as the set of circuits associated with each input of the comparator is as identical as possible on each input.

It has been seen that the NAND gate enables the detection circuit to be insulated during the blowing of the fuse fus1. It can also be used, when the fuse is already fused, to prevent fraudulent individuals from applying a fuse voltage to the fuse fus1 at a value such that there is once again a voltage e1 equal to Vref1. The fuse fus1 would be perceived, by its downline circuits for which precisely the detection has been done, as being not blown. A safety system such as this is necessary for the access locking functions, and especially when the fuse voltage Vpp is given at an external contact.

Finally, the comparator is controlled by an internal voltage reference circuit refc that delivers a reference voltage Vcomp and makes it possible to do away with the fluctuations of the supply voltage Vcc which would disturb the working of the comparator.

The detection circuit is then doubly insulated from the supply: first of all by the internal reference circuit refc and then by the differential comparator which gets tripped only at a voltage difference e2-e1, each circuit arm associated with e2 and e1 being perfectly identical according to the invention.

FIG. 2 shows an exemplary embodiment of a detection circuit according to the invention. The fuse fus1 is connected between the ground and a node A1. This node A1 is connected to the source Sf1 of an N type transistor Tf1. This transistor, which is series connected with the fuse, enables the comparator to be insulated from the fuse during the blowing operation, by placing it in an open circuit (Tf1 non-conductive) by the control signal imposed on its gate Gf1 connected to the node B. The drain Df1 is connected to the output node C1 of a voltage reference circuit ref1.

In the example, the voltage reference circuit ref has:
- a first arm between Vcc and the node C1 having three series connected transistors T1, T2 and T3.

The transistor T1 acts like a switch that may or may not convey the voltage Vcc to the source of the P type transistor T2. The gate of the P type transistor T1 is controlled by a voltage control signal H. The source of the transistor T1 is connected to Vcc. Under these conditions, the transistor T1 is equivalent to a closed switch, when the signal H is set at 0 volts. When the signal H is at five volts, the transistor T1 is equivalent to an open circuit. The drain of the transistor T1 is connected to the source of the transistor T2. The drain of the transistor T2 is connected to the drain of the N type transistor T3. The source of the transistor T3 is connected to the node C1. The gates of the transistors T2 and T3, the source of the transistor T3 and the drain of the transistor T2 are connected together.

- A second arm between the node C1 and the ground includes a P type transistor T4 in series with an N type transistor T5. The drain and the gate of the transistor T4 are connected together and to the drain of the transistor T5. The source of the transistor T5 is connected to the ground. The gate of the transistor T5 is connected to Vcc. A voltage reference circuit such as this is temperature stable for it has, in addition to the transistor T1 which acts as a switch, as many P transistors as it has N transistors. The technological characteristics of each arm are then identical, and the voltage reference Vref1, obtained at C1 by this voltage divider assembly, is stable.

The node C1 is moreover connected to the input e1 of the comparator COMP.

The fuse fus2 is series connected, in a manner identical to the fuse fus1, with a transistor Tf2, the gate of which is also connected to the node B, like the transistor Tf1. Th drain of the transistor Tf2 is connected to the node C2. The node C2 is furthermore connected, firstly, to a voltage reference circuit ref2, identical to the voltage reference circuit ref1 and, secondly, to the input e2 of the comparator COMP.

The transistor Tf2 is technologically identical to the transistor Tf1. The voltage reference circuits ref1 and ref2 are technologically identical. Thus, the circuit included between a fuse and an input of the comparator has the same characteristics on each input e1, e2. The comparator is balanced.

In one known exemplary embodiment, the comparator is formed by two arms B1 and B2. The arm B1 is activated by the input e1 and the arm B2 by the input e2.

The arm B1 has three transistors in series between Vcc and a node M:
- a P type transistor T12;
- a P type transistor T11;
- an N type transistor T10.

The P type transistor T12 acts as a switch, like the voltage reference ref1 transistor T1. Its source is connected to Vcc and its gate to the voltage control signal H. Its drain is connected to the source of the transistor T11. The gate and the drain of the transistor T11 are connected together to the drain of the transistor T10. The source of the transistor T10 is connected to the node M. The gate of the transistor T10 is the input e1 of the comparator.

The arm B2 has three transistors in series between Vcc and the node M:
- a P type transistor T22;
- a P type transistor T21;
- an N type transistor T20.

The P type transistor T22 serves as a switch like the transistor T12: its source is connected to Vcc, and its gate to the voltage control signal H. Its drain is connected to the source of the transistor T21. The gate of the transistor T21 is connected to that of the transistor T11 at the node 0. The drain of the transistor T21 is connected at the node Q to the drain of the transistor T20. The source of the transistor T20 is connected to the node M. The gate of the transistor T20 is the input e2 of the comparator.

An N type transistor T100 is series connected between the node M and the ground Vss of the circuit. Its gate is supplied with the reference voltage Vcomp given by the voltage reference circuit refc associated with the comparator. This voltage reference circuit refc is preferably independent of the supply voltage Vcc. The voltage Vcomp that it delivers therefore does not vary with Vcc. As shall be seen hereinafter, the value of Vcomp is of the order of magnitude of the threshold voltage of the transistor T100: a current I therefore flows in the transistor T100. This current is fixed since the gate voltage of the transistor T100 is fixed (having always the same bias conditions). It is the current that is dictated by a transistor T405 of the voltage reference circuit refc, and with respect to which it is mounted as a current mirror, as shall be seen further below. The current I is proportional to the current flowing in the transistor T405.

When the two fuses are in the initial intact state, the two inputs e1 and e2 are at the same voltage level Vref1=Vref2, delivered by the voltage reference circuits ref1 and ref2. The current that flows in the two arms B1 and B2 of the comparator is then the same, equal to I/2. The transistor T21 is mounted as a current mirror with respect to the transistor T11 (mounted as a forward biased diode): the current flowing in the arm B2 is proportional to the current flowing in the arm B1. The current in the arm B1 is fixed by the transistor T10 which behaves like a resistor. Since the transistors T10 and T20 are identical, and since their gate voltages e1 and e2 are equal, the same current flows in the arms B1 and B2. The voltage at the node 0 is then close to Vcc−VT11, VT11 being the threshold voltage of the transistor T11. The voltage at the node Q assumes a value that depends on the respective resistivity values of the transistors T20 and T21, and may be equal at the most to Vcc.

When the fuse fus1 is blown, it is equivalent to a resistor and draws a certain current that makes the node C1, connected to the input e1, tend towards a voltage close to 0 volts. The transistor T10, the gate of which is then at a voltage close to 0 volts, is off. The transistor T20, the gate of which is still at a voltage e2=Vref2 is still conductive: all the current I drawn by T100 therefore passes into the arm B2. The transistor T20 is less resistive than the transistor T21: it accepts all the current I and it is this transistor that will dictate the potential at the node Q: it therefore tends to make this potential fall to the maximum extent, i.e. to a value that is substantially equal to its conduction threshold: e2=VT20, VT20 being the threshold voltage of the transistor T20.

An inverter placed at the node Q, constituted in a standard way by a P transistor T201, between Vcc and a node R, and an N transistor T200, between the node R and the ground, makes it possible, in a known way, to distinguish between the two states highlighted in the previous two paragraphs.

In the example, the gate of the transistor T200 is supplied by the reference voltage Vcomp. The source of the transistor T201 is supplied by Vcc. The transistor T200 still draws the same current I since it is mounted as a current mirror with respect to the transistor T405 (T200 behaves like a current generator, like the transistor T100). T201 for its part behaves like a controlled resistor.

When the fuse fus1 is not blown, T21 is highly resistive: the potential at the node Q is high, for example of the order of Vcc, the source of the transistor T21 being at Vcc. Then the potential at the node R falls to 0 volts.

When the fuse fus1 is blown, T21 is less resistive: the potential at the node Q is lower, for example of the order of e2=VT20. The potential at the node R rises again. At the most it rises to Vcc, depending on the respective values of resistivity of the transistor T200 and T201.

An inverter INV1, placed at output of the node R, then gives a five-volt output for the fuse that is not blown and a 0-volt output for the blown fuse. It enables the signal to be rectified: the output of the inverter INV1 is the output S of the comparator.

Advantageously, an inverter INV2 and a P transistor T300, that follows the inverter INV2 in a series connection, are parallel connected between an input point of the voltage control signal H and the input of the inverter INV1. Thus, when the circuit is not active, the signal H is at Vcc and T300 is conductive, all the other transistors associated with the signal H (T1, T400, T12, ...) being, for their part, off. Then the transistor T300 dictates a voltage Vcc at the input of the inverter INV1. The output S of the comparator is thus forced to 0. The fuse is seen as being blown: this is a safety function when the circuit is not working.

The reference voltage circuit refc is, for example, set up by a current mirror assembly: a circuit such as this has the advantage of giving a voltage reference that is independent of the supply voltage Vcc. It has, for example, two P type transistors, T400 and T401, each mounted as a switch, like the transistors T12 and T22 of the comparator.

In series with the transistor T400, a P type transistor T402, mounted as a diode (with gate and drain connected together), is itself placed in series with a native N transistor T404. In series with the transistor T401, a P type transistor T403 is placed in series with an N transistor T405 mounted as a diode.

The sources of the N transistors T404 and T405 are connected to the ground. The gates of the transistors T404 and T405 are connected together. The gates of the transistors T402 and T403 are connected together. A construction such as this makes it possible to achieve independence with respect to the supply voltage, for the transistor T402, mounted as a diode, dictates its current in the transistor T403 (through the principle of the current mirror) and, in the same way, the transistor T405, mounted as a diode, dictates its current on the transistor T404: at equilibrium between the two arms constituted respectively by the transistors T402 and T404, T403 and T405, the same current flows in the two arms. The transistors mounted as diodes have their voltage between the gate (or drain) and the source equal to their threshold voltage.

The output Vcomp of the voltage reference circuit refc is taken at the drain of the transistor T405. The reference voltage Vcomp is therefore equal to the threshold voltage of the transistor T404.

In the example, an N type transistor T406, having its gate connected to the voltage control signal H, its drain connected to the gates of the transistors T402 and T403, and its source to the gates of the transistors T404 and T405, enables a current mirror assembly such as this to be brought more swiftly to equilibrium.

As we have seen in FIG. 1, the output S of the comparator is looped to a NAND gate, the output of which controls the fusing circuit and the node B. The other input of the NAND gate is the control signal Cfus for the blowing of the fuse fus1. Only an active fusing command associated with a non-blown state of the fuse fus1, read at output of the comparator, permits the blowing of the fuse fus1. The output of the NAND gate then turns off the transistors Tf1 and Tf2.

The fusing circuit CLAQ then conveys the fuse voltage to the node A1, via the transistor Tc1, which is a native transistor in the example (null threshold voltage): the gate and the source of the transistor Tc1 are then carried to the voltage Vpp.

When the fuse fus1 is not blown, the transistor Tc1 is equivalent to a resistor and the drain capacitance of the transistor Tc1 gets added to the capacitance of the fuse fus1. It is for this reason, and again so that the two inputs e1 and e2 of the comparator may be perfectly balanced, that the transistor Tc2, identical to Tc1, is necessary. The only aim of this transistor Tc2 is to make the two arms between each of the fuses and each input perfectly symmetrical. This symmetry, moreover, will also be met for the topography of the entire detection circuit according to the invention: the set of circuits connected to one fuse is topologically symmetrical with the set of circuits connected to the other fuse.

What is claimed is:

1. A detection circuit for the detection of the state of a first fuse of the type with vertical oxide fusing and which has two possible states, said detection circuit comprising: said first fuse, a second fuse of the type with vertical oxide fusing and having only one possible state, a differential comparator having first and second input nodes and an output node, a first voltage reference circuit, and a second voltage reference circuit, said first fuse being connected between a voltage reference ground and said first input node of said differential comparator, said second fuse being connected between said voltage reference ground and said second input node of said differential comparator, said first voltage reference ground and said first input node of said voltage reference ground and said first input node of said differential comparator, said second voltage reference circuit being connected between said voltage reference ground and said second input node of said differential comparator; wherein said first and second voltage reference circuits provide equal reference voltages.

2. A detection circuit in accordance with claim 1 wherein said first and second fuses are technologically identical when they are in the same state.

3. A detection circuit in accordance with claim 1, wherein said first and second voltage reference circuits are technologically identical.

4. A detection circuit in accordance with claim 3 wherein said first and second fuses are technologically identical when they are in the same state.

5. A detection circuit for the detection of the state of a first fuse of the type with vertical oxide fusing and which has two possible states, said detection circuit comprising: said first fuse, a second fuse of the type with vertical oxide fusing and having only one possible state, a differential comparator having first and second input nodes and an output node, a first voltage reference circuit, and a second voltage reference circuit, said first fuse being connected between a voltage reference ground and said first input node of said differential comparator, said second fuse being connected between said voltage reference ground and said second input node of said differential comparator, said first voltage reference circuit being connected between said voltage reference ground and said first input node of said differential comparator, said second voltage reference circuit being connected between said voltage reference ground and said second input node of said differential comparator; wherein said detection circuit is an integrated circuit, with said detection circuit further comprising a first transistor having a gate, and a logic NAND gate having first and second inputs and an output, wherein said first transistor is connected in series with said first fuse between said voltage reference ground and said first input node of said differential comparator with said first transistor being connected between said first fuse and said first input node of said differential comparator, wherein the output of said NAND gate is connected to the gate of said first transistor, and wherein the output node of said differential comparator is connected to the first input of said NAND gate, whereby a control signal for the blowing of said first fuse can be applied to said second input of said NAND gate and the reading of the state of said first fuse is prevented during the blowing of said first fuse.

6. A detection circuit in accordance with claim 5 further comprising a second transistor having a gate, said second transistor being connected in series with said first fuse between said voltage reference ground and said second input node of said differential comparator with said second transistor being connected between said second fuse and said second input node of said differential comparator, said gate of said second transistor being connected to said output of said NAND gate.

7. A detection circuit in accordance with claim 6 wherein said first and second voltage reference circuits are technologically identical to each other, and wherein said first transistor and said second transistor are technologically identical to each other.

8. A detection circuit in accordance with claim 7 wherein said first and second fuses are technologically identical when they are in the same state.

9. A detection circuit in accordance with claim 6 wherein the elements which define the voltage at said first input node of said differential comparator are identical to the corresponding elements which define the voltage at said second input node of said differential comparator.

10. A detection circuit in accordance with claim 6 wherein the elements which define the voltage at said first input node of said differential comparator are topologically symmetrical with the corresponding elements which define the voltage at said second input node of said differential comparator.

11. A detection circuit in accordance with claim 11 further comprising a supply voltage source and a third voltage reference circuit, wherein said supply voltage source is connected to each of said first and second voltage reference circuits, and wherein said third voltage reference circuit is connected to said differential comparator to provide a reference voltage independent of the supply voltage from said supply voltage source so that fluctuations in the supply voltage from said supply voltage source will not disturb the operation of said differential comparator.

12. A detection circuit in accordance with claim 6 further comprising a fusing circuit, a third transistor with a gate, and a fourth transistor with a gate, said third transistor being connected between said fusing circuit and the connection of said first fuse to said first transistor, with said gate of said third transistor being controlled by said fusing circuit, with said fourth transistor being connected between said voltage reference ground and the connection of said second fuse to said second transistor, with said gate of said fourth transistor being connected to said voltage reference ground.

13. A detection circuit in accordance with claim 12 wherein said first and second voltage reference circuits are technologically identical to each other, wherein said first and second transistors are technologically identical to each other, and wherein said third and fourth transistors are technologically identical to each other.

14. A detection circuit in accordance with claim 13 wherein said first and second fuses are technologically identical when they are in the same state.

15. A detection circuit in accordance with claim 14 wherein the elements which define the voltage at said first input node of said differential comparator are topologically symmetrical with the corresponding elements which define the voltage at said second input node of said differential comparator.

16. A detection circuit in accordance with claim 12 further comprising a supply voltage source and a third voltage reference circuit, wherein said supply voltage source is connected to each of said first and second voltage reference circuits, and wherein said third voltage reference circuit is connected to said differential comparator to provide a reference voltage independent of the supply voltage from said supply voltage source so that fluctuations in the supply voltage from said supply voltage source will not disturb the operation of said differential comparator.

17. A detection circuit in accordance with claim 16 wherein said first and second voltage reference circuits are technologically identical to each other, wherein said first and second transistors are technologically identical to each other, wherein said third and fourth transistors are technologically identical to each other, and wherein said first and second fuses are technologically identical when they are in the same state.

18. A detection circuit in accordance with claim 16 wherein the elements which define the voltage at said first input node of said differential comparator are topologically symmetrical with the corresponding elements which define the voltage at said second input node of said differential comparator.

19. A detection circuit in accordance with claim 1 further comprising a supply voltage source and a third voltage reference circuit, wherein said supply voltage source is connected to each of said first and second voltage reference circuits, and wherein said third voltage reference circuit is connected to said differential comparator to provide a reference voltage independent of the supply voltage from said supply voltage source so that fluctuations in the supply voltage from said supply voltage source will not disturb the operation of said differential comparator.

20. A detection circuit in accordance with claim 1 wherein the elements which define the voltage at said first input node of said differential comparator are topologically symmetrical with the corresponding elements which define the voltage at said second input node of said differential comparator.

21. A circuit for the detection of the state of an integrated circuit fuse, comprising:
a comparator having first and second input connections, and configured to provide an output signal which is dependent on voltages of said input connections;
first and second voltage reference circuits, each connected to provide an identical voltage from a common node to a respective input of said comparator;
a series combination of a first fusible element and a first transistor, connected in parallel with said first voltage reference circuit; and a series combination of a second fusible element and a second transistor, connected in parallel with said second voltage reference circuit;
a third transistor connected to the node between said first fusible element and said first transistor, to selectably provide a high voltage thereto; and wherein no other operable transistor is connected to the node between said second fusible element and said second transistor;
feedback circuitry connected to turn off said first transistor in at least partial dependence on the output state of said comparator;
wherein, if said first fusible element has not been blown, said comparator sees balanced circuit legs at said first and second input connections.

22. The circuit of claim 21, wherein said third transistor is a native transistor.

23. The circuit of claim 21, further comprising an additional voltage reference circuit connected to provide a reference voltage to said comparator.

24. A circuit for the detection of the state of an integrated circuit fuse, comprising:
a comparator having first and second input connections, and configured to provide an output signal which is dependent on voltages of said input connections;
first and second voltage reference circuits, each connected to provide an identical voltage from a common node to a respective input of said comparator;

a series combination of a first fusible element and a first transistor, connected in parallel with said first voltage reference circuit;

a series combination of a second fusible element and a second transistor, connected in parallel with said second voltage reference circuit; said second fusible element being substantially technologically identical to said first fusible element;

a third transistor connected to the node between said first fusible element and said first transistor, to selectably provide a high voltage thereto, and a fourth transistor connected to the node between said second fusible element and said second transistor; said fourth transistor being technologically similar to said third transistor, and being connected to be inoperable;

feedback circuitry connected to turn off said first transistor in at least partial dependence on the output state of said comparator;

whereby, if said first fusible element has not been blown, said comparator sees balanced circuit legs at said first and second input connections.

25. The circuit of claim 24, wherein said third and fourth transistors are both native transistors.

26. The circuit of claim 14, wherein said feedback circuitry is connected to turn off said third and fourth transistors.

27. The circuit of claim 24, further comprising an additional voltage reference circuit connected to provide a reference voltage to said comparator.

* * * * *